(12) United States Patent
Nishio et al.

(10) Patent No.: US 10,680,058 B2
(45) Date of Patent: Jun. 9, 2020

(54) SEMICONDUCTOR DEVICE HAVING REGIONS OF DIFFERENT CONCENTRATON OF LIFETIME KILLER IMPURITY PROVIDED IN A SILICON CARBIDE LAYER

(71) Applicant: Kabushiki Kaisha Toshiba, Minato-ku (JP)

(72) Inventors: Johji Nishio, Machida (JP); Mitsuhiro Kushibe, Setagaya (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 58 days.

(21) Appl. No.: 15/890,446

(22) Filed: Feb. 7, 2018

(65) Prior Publication Data

US 2018/0374918 A1 Dec. 27, 2018

(30) Foreign Application Priority Data

Jun. 26, 2017 (JP) ................. 2017-123874

(51) Int. Cl.
| | | |
|---|---|---|
| *H01L 29/06* | (2006.01) | |
| *H01L 29/868* | (2006.01) | |
| *H01L 29/16* | (2006.01) | |
| *H01L 29/66* | (2006.01) | |
| *H01L 29/739* | (2006.01) | |
| *H01L 29/32* | (2006.01) | |
| *H01L 29/861* | (2006.01) | |
| *H01L 21/265* | (2006.01) | |

(Continued)

(52) U.S. Cl.
CPC .... *H01L 29/0619* (2013.01); *H01L 21/26506* (2013.01); *H01L 29/0615* (2013.01); *H01L 29/1608* (2013.01); *H01L 29/32* (2013.01); *H01L 29/6606* (2013.01); *H01L 29/7395* (2013.01); *H01L 29/868* (2013.01); *H01L 29/8613* (2013.01); *H01L 21/046* (2013.01); *H01L 29/045* (2013.01)

(58) Field of Classification Search
CPC combination set(s) only.
See application file for complete search history.

(56) References Cited

U.S. PATENT DOCUMENTS

| 8,598,622 B2 | 12/2013 | Sadamatsu et al. | |
|---|---|---|---|
| 2012/0146055 A1* | 6/2012 | Mitani | H01L 29/0619 257/77 |

(Continued)

FOREIGN PATENT DOCUMENTS

| JP | 2007-158223 | 6/2007 |
|---|---|---|
| JP | 5621703 | 11/2014 |

(Continued)

*Primary Examiner* — Nduka E Ojeh
(74) *Attorney, Agent, or Firm* — Oblon, McClelland, Maier & Neustadt, L.L.P.

(57) ABSTRACT

A semiconductor device of the embodiment includes: a first region provided in a silicon carbide layer; and a second region provided around the first region in the silicon carbide layer, the second region having a higher concentration of at least one kind of a lifetime killer impurity selected from the group consisting of B (boron), Ti (titanium), V (vanadium), He (helium) and H+ (proton) than a concentration of a lifetime killer impurity in the first region.

17 Claims, 7 Drawing Sheets

(51) Int. Cl.
*H01L 21/04* (2006.01)
*H01L 29/04* (2006.01)

(56) References Cited

U.S. PATENT DOCUMENTS

| | | | |
|---|---|---|---|
| 2013/0264674 A1* | 10/2013 | Mizushima | H01L 21/324 257/487 |
| 2014/0197477 A1* | 7/2014 | Onishi | H01L 29/7811 257/329 |
| 2015/0115283 A1* | 4/2015 | Domeij | H01L 29/32 257/77 |
| 2015/0263115 A1* | 9/2015 | Hiyoshi | H01L 29/402 257/77 |
| 2016/0276497 A1 | 9/2016 | Mizukami | |
| 2018/0323263 A1* | 11/2018 | Tawara | H01L 21/02494 |

FOREIGN PATENT DOCUMENTS

| | | |
|---|---|---|
| JP | 2016-100455 | 5/2016 |
| JP | 2016100455 A * | 5/2016 |
| JP | 2016-174032 | 9/2016 |

\* cited by examiner

SEMICONDUCTOR DEVICE HAVING REGIONS OF DIFFERENT CONCENTRATON OF LIFETIME KILLER IMPURITY PROVIDED IN A SILICON CARBIDE LAYER

CROSS-REFERENCE TO RELATED APPLICATION

This application is based upon and claims the benefit of priority from Japanese Patent Application No. 2017-123874, filed on Jun. 26, 2017, the entire contents of which are incorporated herein by reference.

FIELD

Embodiments described herein relate generally to a semiconductor device.

BACKGROUND

As a material for a next-generation power semiconductor device, SiC (silicon carbide) has been expected. SiC has superior physical properties such as a bandgap of about three times, breakdown voltage strength of about 10 times and thermal conductivity of about three times as much as those of Si (silicon). By utilizing these physical properties, a power semiconductor device with low loss, which can be operated at a high temperature, can be realized.

It has been required to suppress thermal destruction, which may be caused by heating of an SiC power device.

DETAILED DESCRIPTION

Hereinafter, embodiments of the present disclosure will be described with reference to the drawings.

In the present specification, in order to indicate positional relations of elements and the like, an upward direction of the drawings is expressed as "on", and a downward direction of the drawings is expressed as "below". In the present specification, such terms of "on" and "below" are not always based on the direction of the gravity.

In the below description, $n^+$, n, $n^-$ and $p^+$, p, $p^-$ represent relative levels of impurity concentrations in respective conductive types. That is, $n^+$ means an n-type impurity concentration is relatively higher than n, and $n^-$ means an n-type impurity concentration is relatively lower than n. Similarly, $p^+$ means a p-type impurity concentration is relatively higher than p, and $p^-$ means a p-type impurity concentration is relatively lower than p. Incidentally, $n^+$-type and $n^-$-type may be simply referred to as n-type, and $p^+$-type and $p^-$-type may be simply referred to as p-type.

Hereinafter, a first conductivity-type denotes n-type and the second conductivity-type denotes p-type.

First Embodiment

The semiconductor device of the present embodiment includes: a first region provided in a silicon carbide layer; and a second region provided around the first region in the silicon carbide layer, the second region having a higher concentration of at least one kind of a lifetime killer impurity selected from the group consisting of B (boron), Ti (titanium), V (vanadium), He (helium) and $H^+$ (proton) than a concentration of a lifetime killer impurity in the first region.

Figure 1:
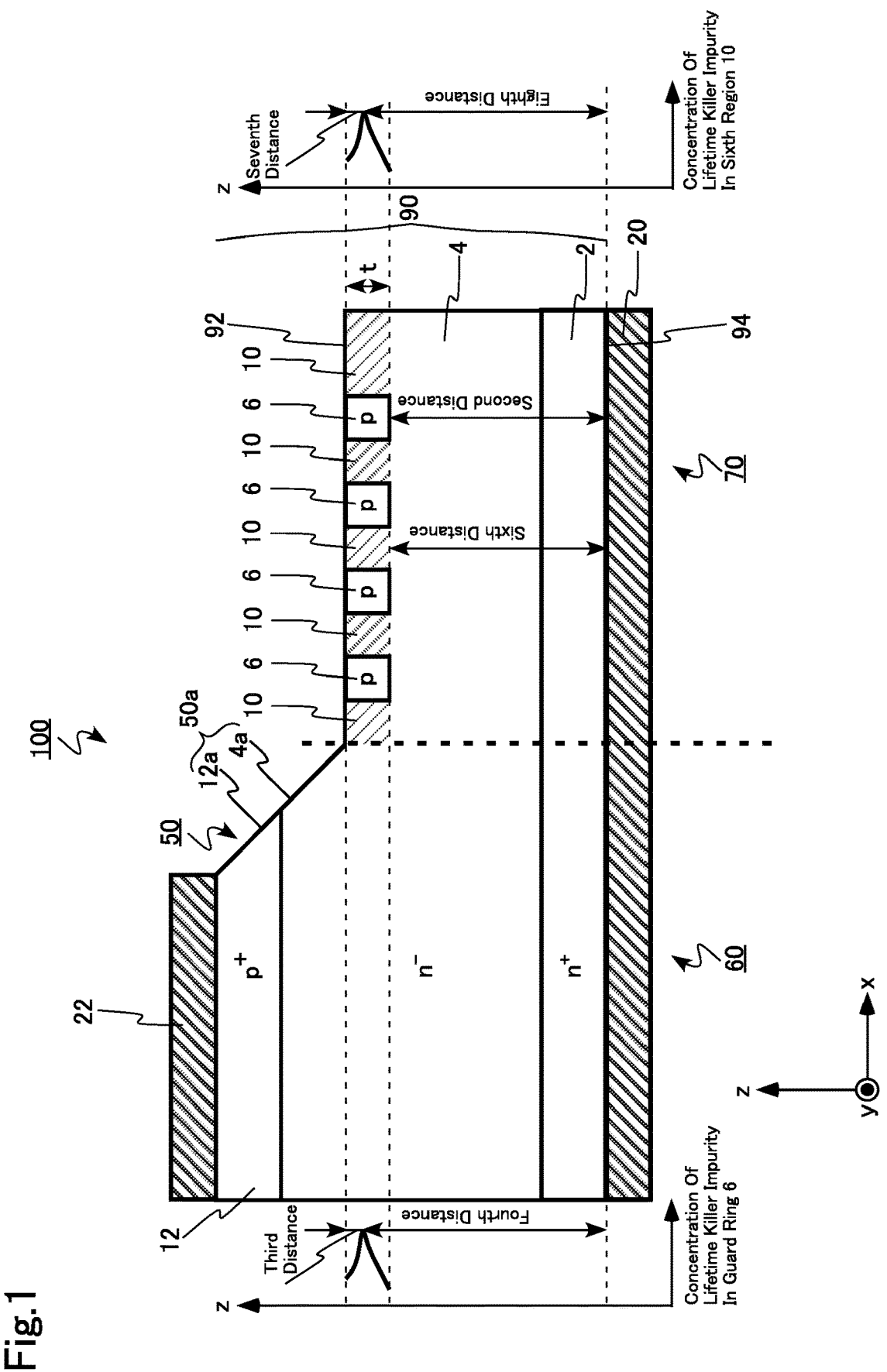
FIG. 1 is a schematic cross-sectional view of a semiconductor device of a first embodiment.

FIG. 1 is a schematic cross-sectional view of the semiconductor device 100 of the present embodiment.

The semiconductor device 100 of the present embodiment is a mesa-type PIN diode.

A silicon carbide layer 90 includes a silicon carbide substrate (third region) 2, an anode layer (seventh region) 12 and a drift layer (fourth region) 4 provided between the silicon carbide substrate 2 and the anode layer 12. In other words, the drift layer 4 is provided on the silicon carbide substrate 2, and the anode layer 12 is provided on the drift layer 4.

The silicon carbide substrate 2 is, for example, an $n^+$-type single crystal substrate. The silicon carbide substrate 2 is, for example, a substrate of 4H—SiC having a surface inclined from a (0001) plane at an off angle of 0.2° to 10°. An n-type impurity is, for example, N (nitrogen). An impurity concentration is, for example, $5\times10^{17}$ $cm^{-3}$ or more and $5\times10^{19}$ $cm^{-3}$ or less.

The $n^-$-type drift layer 4 contains, for example, N (nitrogen) as an n-type impurity, and an impurity concentration is $1\times10^{15}$ $cm^{-3}$ or more and $5\times10^{16}$ $cm^{-3}$ or less. A film thickness of the drift layer 4 is, for example, about 5 μm to about 10 μm. The concentration of N may be a constant value in the above-described range, or may have a concentration gradient in the above-described range.

The p-type anode layer 12 contains, for example, Al (aluminum) as an p-type impurity, and an impurity concentration is $1\times10^{18}$ $cm^{-3}$ or more and $1\times10^{22}$ $cm^{-3}$ or less.

An anode electrode (first electrode) 22 is electrically connected with the anode layer 12. The anode electrode 22 is provided, for example, on the anode layer 12. In other words, the anode layer 12 is provided between the anode electrode 22 and the drift layer 4. The anode electrode 22 is composed of, for example, a metal layer of Al and a barrier metal layer of Ni (nickel) provided between the metal layer of Al and the anode layer 12.

The drift layer 4 and the anode layer 12 have a mesa structure 50. The anode layer 12 has a side surface 12a of the anode layer in a part of the mesa structure 50. The drift layer 4 has a side surface 4a of the drift layer in a part of the mesa structure 50. A side surface 50a of the mesa structure 50 includes the side surface 12a of the anode layer and the side surface 4a of the drift layer. A first surface 92 is provided around the mesa structure 50 on the drift layer 4. The side surface 4a of the drift layer is provided between the side surface 12a of the anode layer and the first surface 92.

A second surface 94 is a surface of the silicon carbide substrate 2, which is provided on an opposite side of the first surface 92, in the silicon carbide layer 90.

Here defines an X-axis, a Y-axis which is an axis perpendicular to the X-axis and a Z-axis which is perpendicular to both of the X-axis and the Y-axis. The first surface 92 and the second surface 94 are provided within an XY plane.

A cathode electrode (second electrode) 20 is in contact with the silicon carbide substrate 2 by the second surface 94 so as to be electrically connected with the silicon carbide substrate 2. The silicon carbide substrate 2 is provided between the cathode electrode 20 and the drift layer 4. The cathode electrode 20 is made of, for example, Ni.

A p-type guard ring (fifth region) 6 is provided on the drift layer 4 around the mesa structure 50 so as to surround the mesa structure 50. The guard ring 6 is a kind of a junction termination structure, and for example, a plurality of the guard rings 6 are provided on the drift layer 4. The guard ring 6 is used for alleviating an electric field. The guard ring 6 contains Al that is a p-type impurity.

A second distance from the second surface 94 to the guard ring 6 is longer than a first distance from the first surface 92 to the guard ring 6. In the semiconductor device 100 shown in FIG. 1, a part of the guard ring 6 is provided in contact with the first surface 92. In other words, the first distance is zero.

The guard ring 6 contains at least one kind of a lifetime killer impurity selected from the group consisting of B, Ti, V, He and H. B, Ti and V are injected into the semiconductor device by, for example, ion implantation. Further, He is injected by He radiation, and $H^+$ is injected into the semiconductor device by proton radiation.

A concentration of B, Ti or V in the guard ring 6 preferably has a maximal value at a point where a fourth distance from the second surface 94 is longer than a third distance from the first surface 92. Incidentally, the "maximal value" may be a "maximum value".

An $n^-$-type sixth region 10 is provided adjacently to the guard ring 6 on the drift layer 4 around the guard ring 6. In the case where the plurality of the guard rings 6 are provided, the sixth region 10 is provided, for example, each between the plurality of the guard rings 6. The sixth region 10 contains at least one kind of a lifetime killer impurity selected from the group consisting of B, Ti, V, He and H.

A sixth distance from the second surface 94 to the sixth region 10 is longer than a fifth distance from the first surface 92 to the sixth region 10. In the semiconductor device 100, a part of the sixth region 10 is provided in contact with the first surface 92. In other words, the fifth distance is zero.

A concentration of B, Ti or V in the sixth region 10 preferably has a maximal value at a point where an eighth distance from the second surface 94 is longer than a seventh distance from the first surface 92, similarly to the guard ring 6. Incidentally, the "maximal value" may be a "maximum value".

The sixth region 10 is preferably formed by injecting the lifetime killer impurity into the guard ring 6 and the sixth region 10 simultaneously by ion implantation, He radiation or proton radiation, because a manufacturing process can be simplified. Incidentally, in the case of forming the sixth region 10 and the guard ring 6 simultaneously, it is preferable that the third distance is equal to the seventh distance and the fourth distance is equal to the eighth distance.

An active region (first region) 60 is a region provided in the silicon carbide layer 90 and in which a current flows when a voltage is applied to the semiconductor device 100. Since the current flows in a Z direction, the active region 60 includes, for example, the anode layer 12, a part of the drift layer 4 directly below the anode layer 12 and a part of the silicon carbide substrate 2 directly below the anode layer 12.

A termination region (second region) 70 is provided in the silicon carbide layer 90 around the active region 60 so as to surround the active region 60. The termination region 70 includes a part of the drift layer 4, which is provided around the part of the drift layer 4 included in the active region 60.

Further, the termination region 70 includes a part of the silicon carbide substrate 2, which is provided around the part of the silicon carbide substrate 2 included in the active region 60. Moreover, the termination region 70 includes the guard ring 6 and the sixth region 10.

The silicon carbide substrate 2 is provided between the first surface 92 and the second surface 94 and is provided in the active region 60 and the termination region 70. The drift layer 4 is provided between the first surface 92 and the silicon carbide substrate 2 and is provided in the active region 60 and the termination region 70.

Incidentally, the third distance and the seventh distance are preferably shorter than a film thickness t of the guard ring 6, because the addition of the lifetime killer impurity can be easier.

The concentration of B, Ti or V in the guard ring 6 or the sixth region 10 is preferably 1/10 or more and 1/2 or less of the concentration of the n-type impurity in the drift layer 4.

Impurity concentration distribution can be measured by, for example, secondary ion mass spectrometry (SIMS) or the like.

A carrier lifetime of the termination region 70 is preferably 1 μs or less. Incidentally, the carrier lifetime can be measured by, for example, microwave photo conductivity decay (μ-PCD).

Next, a method for manufacturing the semiconductor device 100 of the present embodiment will be described.

Figure 2:
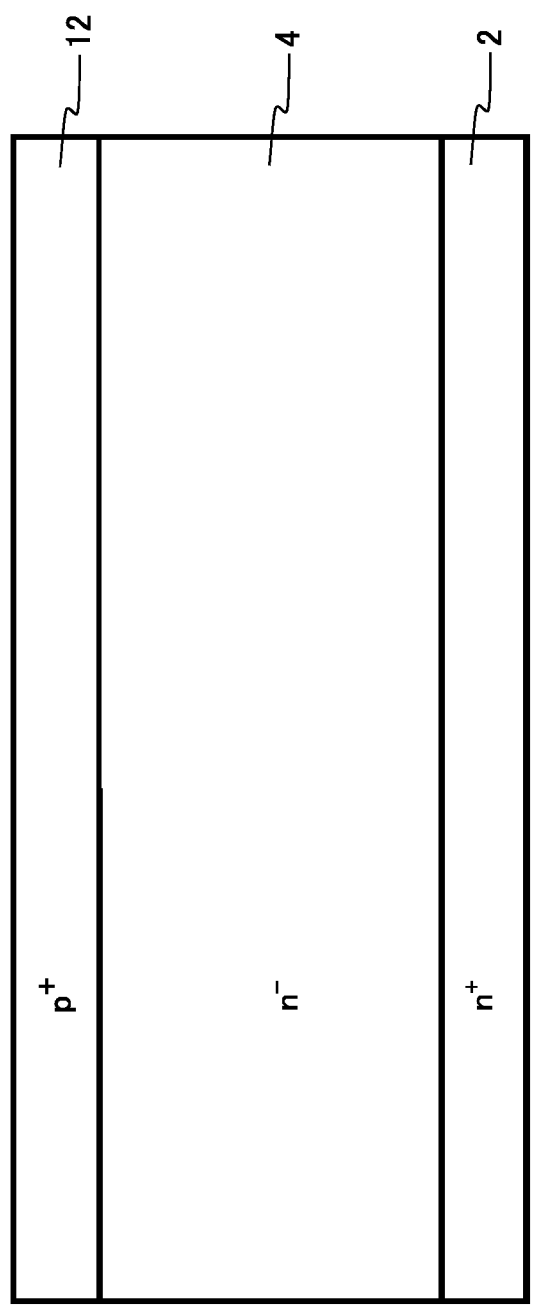
FIG. 2 is a schematic cross-sectional view illustrating the semiconductor device of the first embodiment in the middle of manufacture in a method for manufacturing the semiconductor device.

FIG. 2 is a schematic cross-sectional view illustrating a method for manufacturing the semiconductor device 100 of the present embodiment.

The method for manufacturing the semiconductor device 100 of the present embodiment includes: forming the $n^-$-type drift layer 4 on the $n^+$-type silicon carbide substrate 2; forming the $p^+$-type anode layer 12 on the drift layer 4; forming the mesa structure 50 including the drift layer 4 and the anode layer 12 on the drift layer 4; forming the p-type guard ring 6 on the drift layer 4 around the mesa structure 50; forming the sixth region 10 on the drift layer 4 around the guard ring 6; forming the anode electrode 22 to be electrically connected with the anode layer 12; and forming the cathode electrode 20 to be electrically connected with the cathode electrode 20.

Firstly, the $n^-$-type drift layer 4 is formed on the $n^+$-type silicon carbide substrate 2 by, for example, an epitaxial growth method.

Next, the $p^+$-type anode layer 12 is formed on the drift layer 4 by, for example, an epitaxial growth method (FIG. 2).

Figure 3:
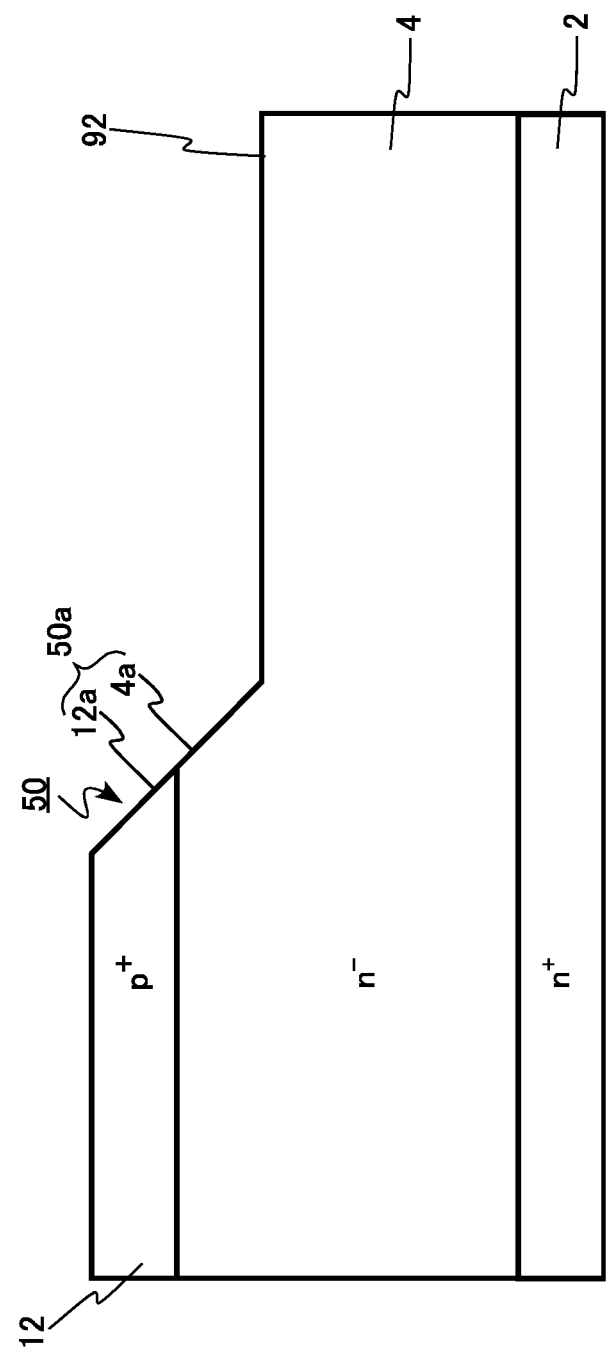
FIG. 3 is a schematic cross-sectional view illustrating the semiconductor device of the first embodiment in the middle of manufacture in a method for manufacturing the semiconductor device.

Subsequently, the part of the drift layer 4 and the part of the anode layer 12 are removed by, for example, a photolithography method and etching so as to form the mesa structure 50 including the drift layer 4 and the anode layer 12 on the drift layer 4 (FIG. 3). At this time, the side surface 12a of the anode layer is formed on the anode layer 12 in the part of the mesa structure 50. Further, the side surface 4a of the drift layer is formed on the drift layer 4 in the part of the mesa structure 50. Moreover, the first surface 92 is formed on the drift layer 4 around the mesa structure 50.

Figure 4:
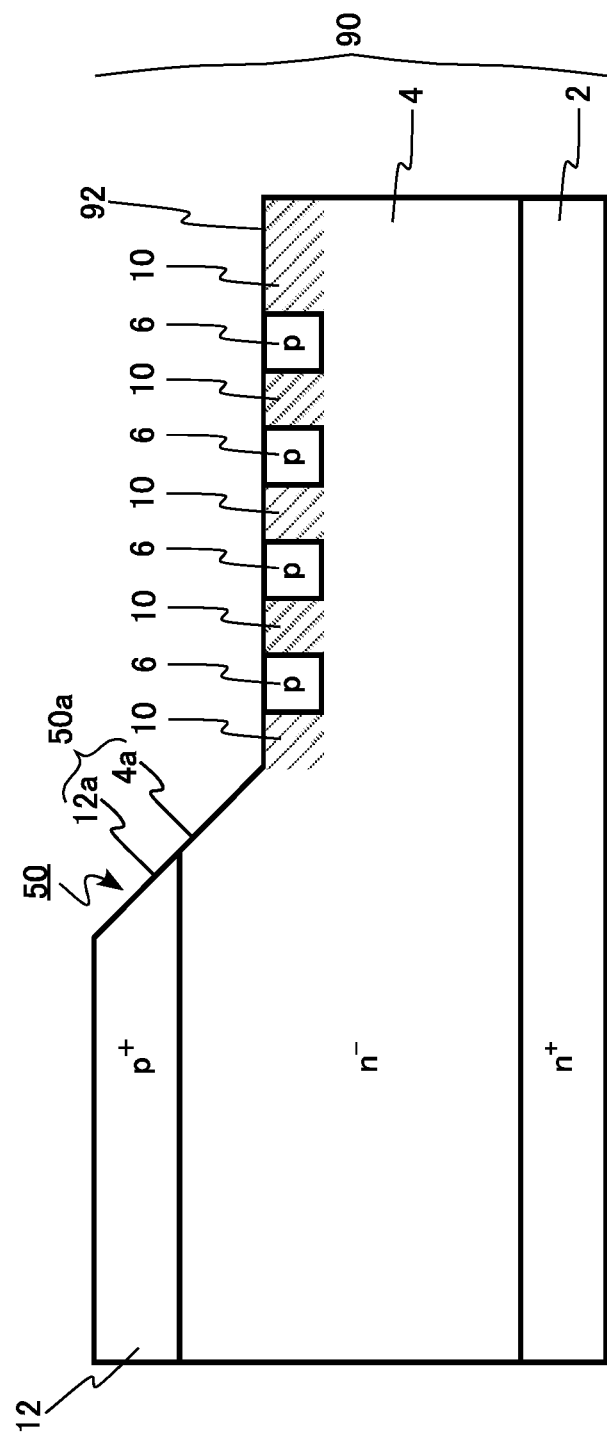
FIG. 4 is a schematic cross-sectional view illustrating the semiconductor device of the first embodiment in the middle of manufacture in a method for manufacturing the semiconductor device.

Next, the p-type guard ring 6 is formed on the drift layer 4 around the mesa structure 50 so as to surround the mesa structure 50 by, for example, ion implantation. Further, the sixth region 10 is formed by injecting the lifetime killer impurity into the guard ring 6 and the drift layer 4 around the guard ring 6 by, for example, ion implantation (FIG. 4).

Subsequently, the anode electrode 22 which is to be electrically connected with the anode layer 12 is formed, and the cathode electrode 20 which is to be electrically connected with the cathode electrode 20 is formed, thereby obtaining the semiconductor device 100 of the present embodiment.

A PIN diode in a level of 1.2 kV according to the semiconductor device 100 of the present embodiment was manufactured by using the silicon carbide substrate 2 which has a substrate surface of a C-plane and setting the N concentration in the drift layer 4 to be $1 \times 10^{16}$ cm$^3$, and was checked to be operated favorably.

Next, effects of the semiconductor device 100 of the present embodiment will be described.

Like the semiconductor device 100 of the present embodiment, the termination region 70 having a higher concentration of at least one kind of a lifetime killer impurity selected from the group consisting of B (boron), Ti (titanium), V (vanadium), He (helium) and H$^+$ (proton) than that in the active region 60 is provided in the silicon carbide layer 90 around the active region 60, whereby the carrier lifetime of the termination region 70 can be shorter than a carrier lifetime of the active region 60, so that the semiconductor device 100 with a lowered ON-state voltage and suppressed thermal destruction can be provided.

Hereinafter, effects will be explained in more detail.

If the carrier lifetime is increased, the number of carriers accumulated in the semiconductor device is increased, and a conductivity modulation effect is accordingly enlarged, whereby the ON-state voltage can be decreased.

However, when turning off the semiconductor device, a small number of carriers accumulated in the termination region 70 flow into the active region 60. At this time, if the carrier lifetime of the termination region 70 is long, a current flows concentratedly at a connection between the active region 60 and the termination region 70, thereby causing thermal destruction of the semiconductor device.

In the semiconductor device 100 of the present embodiment, the concentration of the lifetime killer impurity of the termination region 70 is made higher than the concentration of the lifetime killer impurity of the active region 60. That is, the lifetime killer impurity is selectively introduced into the termination region 70. Thereby, the carrier lifetime of the termination region 70 can be shorter than the carrier lifetime of the active region 60.

Thus, the number of the carriers injected into the termination region 70 is decreased because of the shorter carrier lifetime. Therefore, the number of the carriers which flows from the termination region 70 into the active region 60 at the time of turning off is decreased, and a calorific value per unit time is accordingly decreased, thereby suppressing the thermal destruction.

Whereas, since the carrier lifetime of the active region 60 is similar to that of the conventional one, a forward characteristic can be maintained, so that the ON-state voltage can be decreased. Thereby, both of the decrease in ON-state voltage and the suppress of thermal destruction can be attained at the same time.

As the lifetime killer impurity, either of B, Ti, V, He and H$^+$ can be used preferably. Each of B, Ti and V shortens the carrier lifetime. When injecting He or H$^+$, a lattice defect is introduced into a semiconductor layer when it is injected, thereby shortening the carrier lifetime.

In the semiconductor device 100 of the present embodiment, the p-type guard ring 6 is provided so that the second distance from the second surface 94 may be longer than the first distance from the first surface 92. In other words, the guard ring 6 is provided at a position closer to the first surface 92 in the silicon carbide layer 90.

Then, the concentration of B, Ti or V in the guard ring 6 has the maximal value at the point where the fourth distance from the second surface 94 is longer than the third distance from the first surface 92. In other words, the concentration of B, Ti or V in the guard ring 6 has the maximal value at a position closer to the first surface 92 in the silicon carbide layer 90. Due to such concentration distribution of B, Ti or V, the carrier lifetime of the termination region 70 can be shortened with a small amount of the lifetime killer impurity. Incidentally, the "maximal value" may be a "maximum value".

The concentration of B, Ti or V in the guard ring 6 is preferably ⅒ or more and ½ or less of the concentration of the n-type impurity in the drift layer 4. In order to obtain the effect for shortening the carrier lifetime, the concentration of B, Ti or V in the guard ring 6 is preferably ⅒ or more of the concentration of the n-type impurity in the drift layer 4. On the other hand, if the concentration of B, Ti or V in the guard ring 6 exceeds ½, crystallinity of the silicon carbide may be disordered.

By providing the sixth region 10, the carrier lifetime of the termination region 70 can be shortened more.

By providing the sixth region 10 at the point where the sixth distance from the second surface 94 to the sixth region 10 is longer than the fifth distance from the first surface 92 to the sixth region 10, that is, at the position closer to the first surface 92, the carrier lifetime of the termination region 70 can be shortened with the small amount of the lifetime killer impurity.

The concentration of B, Ti or V in the sixth region 10 preferably has the maximal value at the point where the eighth distance from the second surface 94 is longer than the seventh distance from the first surface 92, because the carrier lifetime of the termination region 70 can be shortened with the small amount of the lifetime killer impurity. Further, it is preferable that the third distance is equal to the seventh distance and the fourth distance is equal to the eighth distance, because the manufacturing process can be easier.

The concentration of B, Ti or V in the sixth region 10 is preferably ⅒ or more and ½ or less of the concentration of the n-type impurity in the drift layer 4, similarly to the concentration of B, Ti or V in the guard ring 6.

If the lifetime of the termination region 70 is 1 μs or less, the thermal destruction can be suppressed favorably.

According to the semiconductor device of the present embodiment, the semiconductor device attaining both of the decrease in ON-state voltage and the suppress of thermal destruction can be provided.

Second Embodiment

A semiconductor device of the present embodiment is different from the semiconductor device of the first embodiment in a point that it has a junction termination extension (JTE) structure. Herein, description of the points overlapped with the first embodiment will be omitted.

FIG. 3 is a schematic cross-sectional view of the semiconductor device 200 of the present embodiment.

A p-type JTE (fourth region) 8 is provided in contact with both of the side surface 4a of the drift layer and the first surface 92. The JTE 8 is a kind of a junction termination structure, and is used for alleviating an electric field. The JTE 8 contains Al that is a p-type impurity.

Incidentally, the JTE 8 and the guard ring 6 may be used in combination.

A PIN diode in a level of 1.2 kV according to the semiconductor device 200 of the present embodiment was manufactured by using the n⁺-type silicon carbide substrate 2 that has a substrate surface of a C-plane and setting the N concentration in the drift layer 4 to be $1\times10^{16}$ cm³, and was checked to be operated favorably.

Also according to the semiconductor device of the present embodiment, the semiconductor device attaining both of the decrease in ON-state voltage and the suppress of thermal destruction can be provided.

Third Embodiment

A semiconductor device of the present embodiment is different from the semiconductor devices of the first and second embodiments in a point that it is an insulated gate bipolar transistor (IGBT). Herein, description of the points overlapped with the first embodiment will be omitted.

FIG. 4 is a schematic cross-sectional view of the semiconductor device 300 of the present embodiment.

In the semiconductor device 300 of the present embodiment, the silicon carbide layer 90 is composed of the silicon carbide substrate 2 and the drift layer 4.

The silicon carbide substrate 2 is, for example, a p⁺-type single crystal substrate. The silicon carbide substrate 2 is, for example, a substrate of 4H—SiC having a surface inclined from a (0001) plane at an off angle of 0.2° to 10°. The silicon carbide substrate 2 contains Al (aluminum) as a p-type impurity, and an impurity concentration is $5\times10^{18}$ cm⁻³ or more and $1\times10^{19}$ cm⁻³ or less.

A gate insulation film (first insulation film) 30 is provided on the first surface 92 in the active region 60. The gate insulation film 30 is, for example, a silicone oxide film or a high-k film.

A gate electrode (first electrode) 28 is provided on the gate insulation film 30. The gate electrode 28 contains, for example, polycrystal silicon with an impurity doped.

An interlayer insulation film (second insulation film) 32 is provided around the gate electrode 28.

An emitter electrode (second electrode) 26 is provided around the interlayer insulation film 32 on the first surface 92, and a part of the emitter electrode 26 is in contact with the first surface 92. The emitter electrode 26 has a layered structure of, for example, Ti (titanium)/Al (aluminum), and can be formed by a well-known process. Incidentally, the emitter electrode 26 may be in contact with the first surface 92 via barrier metal having a layered structure of Ti (titanium)/TiN (titanium nitride)/Al.

A p-type well region (eighth region) 34 is provided in the drift layer 4. At least a part of the well region 34 is in contact with the gate insulation film 30. The well region 34 functions as a channel.

A p⁺-type contact region (ninth region) 38 is provided in the well region 34. A part of the well region 34 is provided between the drift layer 4 and the contact region 38. Further, the contact region 38 is in contact with the emitter electrode 26.

An n⁺-type source region (tenth region) 36 is provided between the part of the well region 34 which is in contact with the gate insulation film 30 and the contact region 38. The source region 36 is in contact with the contact region 38. A part of the well region 34 is provided between the drift layer 4 and the source region 36.

A collector electrode (third electrode) 24 is in contact with the silicon carbide substrate 2 by the second surface 94 so as to be electrically connected with the silicon carbide substrate 2. The silicon carbide substrate 2 is provided between the collector electrode 24 and the drift layer 4. The collector electrode 24 is formed of, for example, Ni.

An IGBT in a level of 6.5 kV according to the semiconductor device 300 of the present embodiment was manufactured by using a p⁺-type silicon carbide substrate 2 which has a substrate surface of an Si-plane and setting the N concentration in the drift layer 4 to be $5\times10^{15}$ cm³, and was checked to be operated favorably.

Incidentally, the p⁺-type silicon carbide substrate 2 having a substrate surface of an C-plane can also be used favorably.

Also according to the semiconductor device of the present embodiment, the semiconductor device attaining both of the decrease in ON-state voltage and the suppress of thermal destruction can be provided.

Fourth Embodiment

A semiconductor device of the present embodiment is different from the semiconductor device of the third embodiment in a point that it has a junction termination extension (JTE) structure. Herein, description of the points overlapped with the first embodiment will be omitted.

Figure 5:
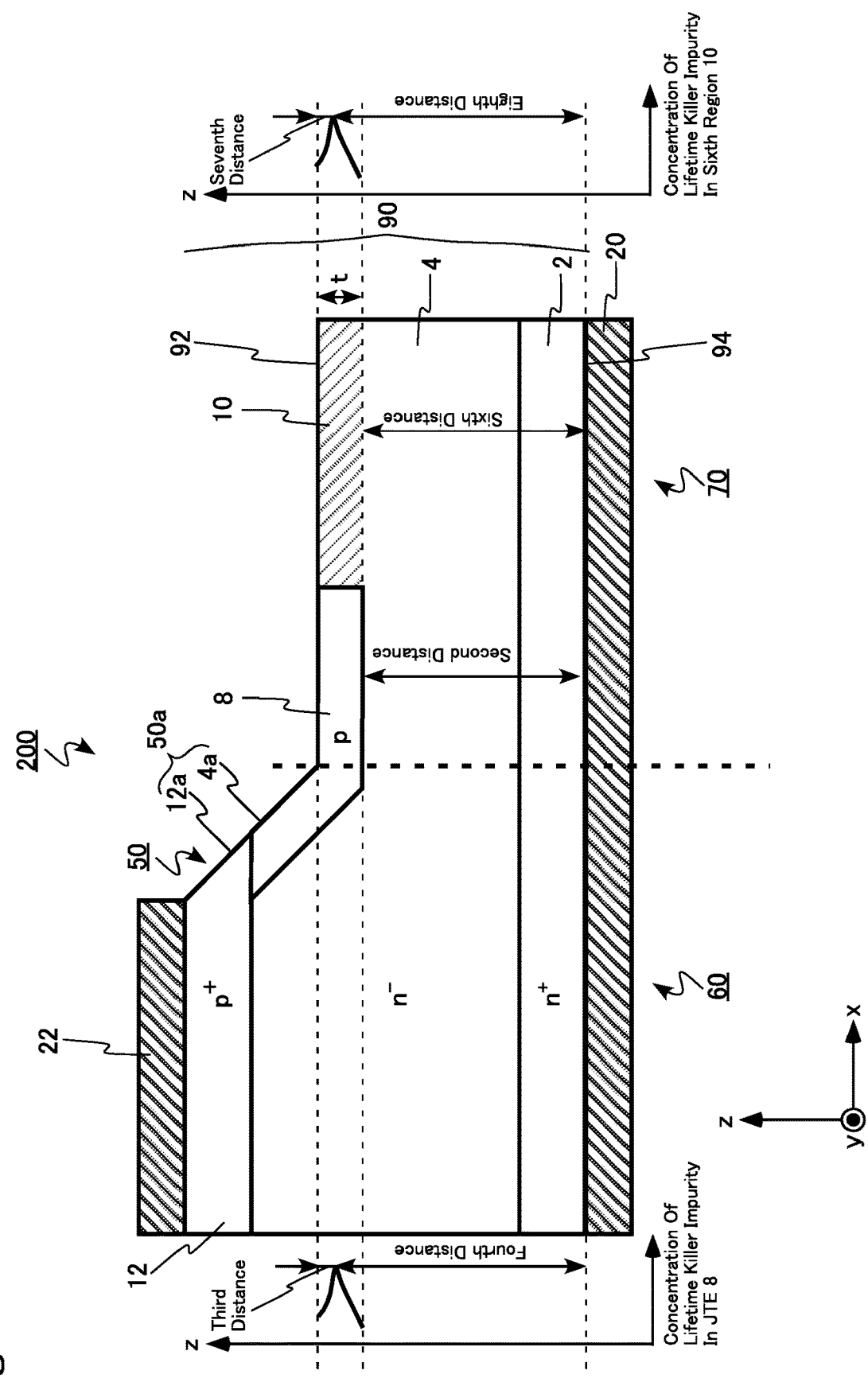
FIG. 5 is a schematic cross-sectional view of a semiconductor device of a second embodiment.
Figure 6:
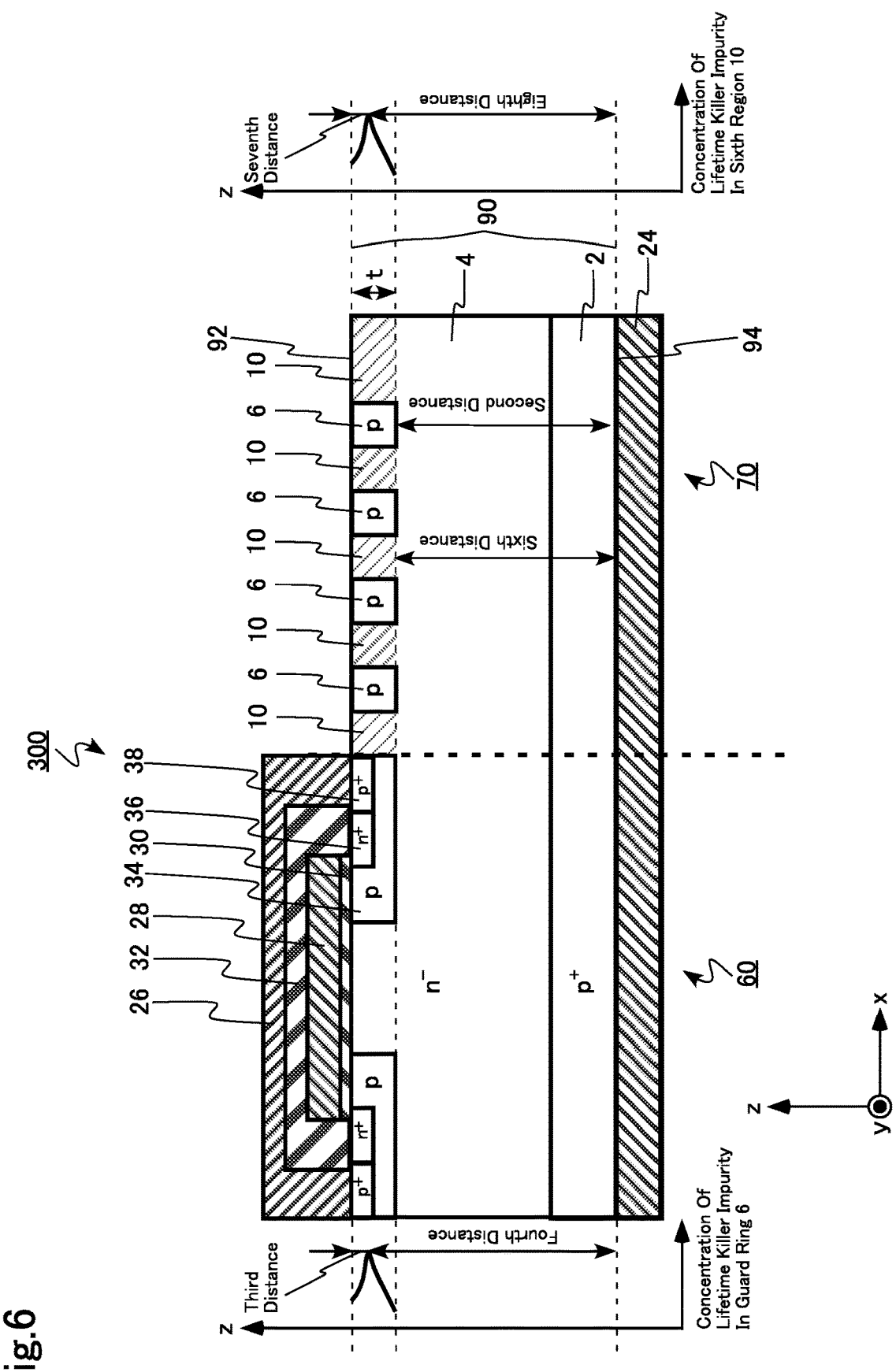
FIG. 6 is a schematic cross-sectional view of a semiconductor device of a third embodiment.
Figure 7:
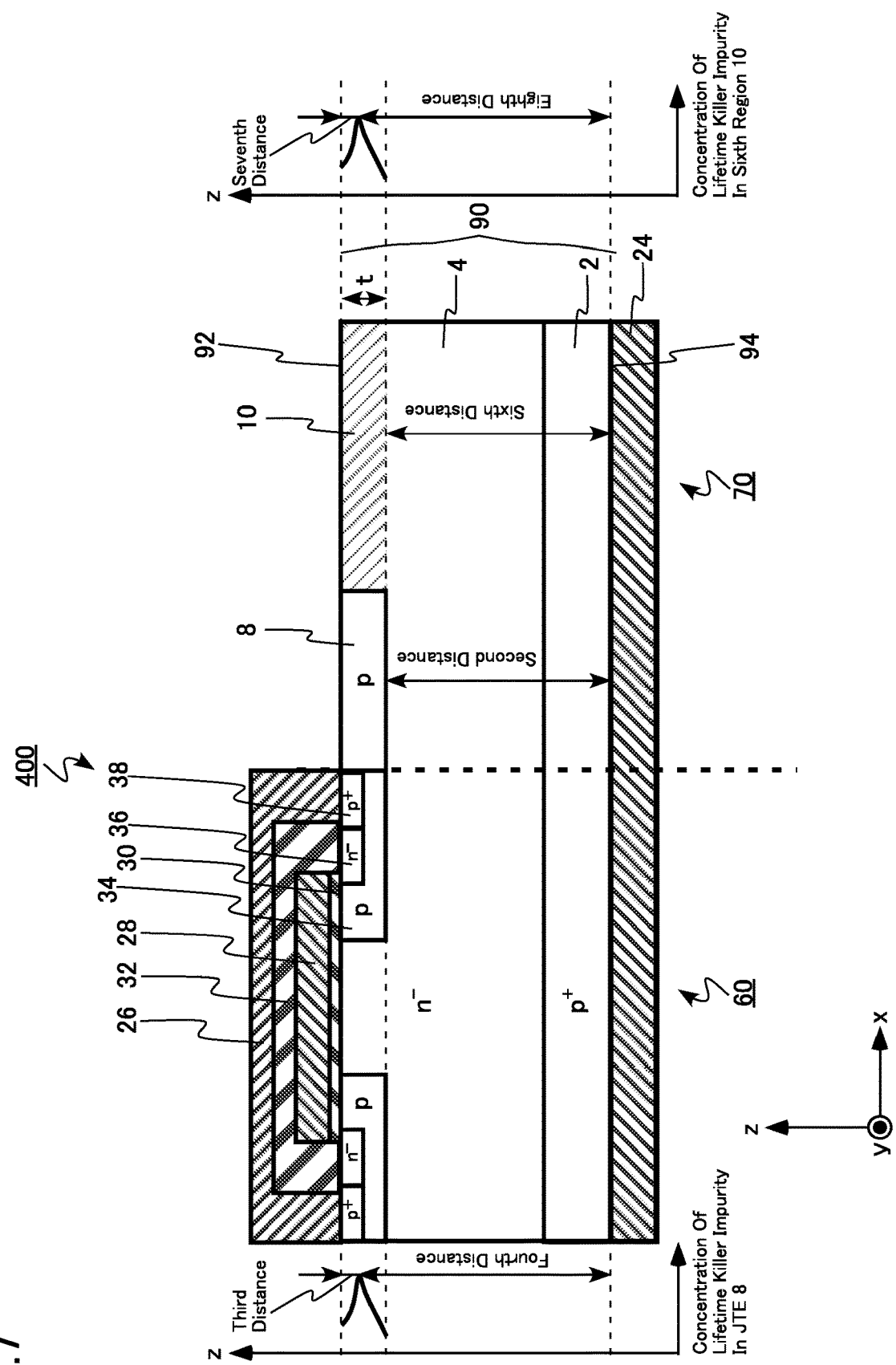
FIG. 7 is a schematic cross-sectional view of a semiconductor device of a fourth embodiment.

FIG. 5 is a schematic cross-sectional view of the semiconductor device 400 of the present embodiment.

An IGBT in a level of 6.5 kV according to the semiconductor device 400 of the present embodiment was manufactured by using the p⁺-type silicon carbide substrate 2 that has the substrate surface of an Si-plane and setting the N concentration in the drift layer 4 to be $5\times10^{16}$ cm³, and was checked to be operated favorably.

Incidentally, the p⁺-type silicon carbide substrate 2 having the substrate surface of a C-plane can also be used favorably.

Also according to the semiconductor device of the present embodiment, the semiconductor device attaining both of the decrease in ON-state voltage and the suppress of thermal destruction can be provided.

According to the semiconductor device of at least one of the above-described embodiments, by the provision of: the first region provided in the silicon carbide layer and in which a current flows when a voltage is applied to the semiconductor device; and the second region provided around the first region in the silicon carbide layer and has a higher concentration of at least one kind of a lifetime killer impurity selected from the group consisting of B (boron), Ti (titanium), V (vanadium), He (helium) and H⁺ (proton) than that in the first region, the semiconductor device attaining both of the decrease in ON-state voltage and the suppress of thermal destruction can be provided.

While certain embodiments have been described, these embodiments have been presented byway of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first region provided in a silicon carbide layer; and a second region provided around the first region in the silicon carbide layer, the second region having a higher concentration of at least one kind of a lifetime killer impurity selected from the group consisting of B (boron), Ti (titanium), V (vanadium), He (helium) and H⁺ (proton) than a concentration of a lifetime killer impurity in the first region, wherein the silicon carbide layer includes:
a first surface;
a second surface;
a second conductivity-type third region provided between the first surface and the second surface, the third region provided in the first region and the second region; and
a first conductivity-type fourth region provided between the first surface and the third region, the fourth region provided in the first region and the second region, wherein
the second region includes a second conductivity-type fifth region, a second distance of the fifth region from the second surface is longer than a first distance of the fifth region from the first surface, and wherein
the fifth region includes a concentration of B, Ti or V which has a maximal value at a point where a fourth distance of the fifth region from the second surface is longer than a third distance of the fifth region from the first surface, and wherein
the concentration of B, Ti or V in the fifth region is 1/10 or more and 1/2 or less of a concentration of a first conductivity-type impurity in the fourth region.

2. The device according to claim 1, wherein a current flows in the first region when a voltage is applied to the semiconductor device.

3. The device according to claim 1, wherein a carrier lifetime of the second region is 1 µs or less.

4. The device according to claim 1, further comprising:
a first insulation film provided on the first surface in the first region;
a first electrode provided on the first insulation film;
a second insulation film provided around the first electrode;
a second electrode provided around the second insulation film on the first surface, a part of the second electrode being in contact with the first surface;
an eighth region provided in the fourth region, a part of the eighth region being in contact with the first insulation film;
a ninth region provided in the eighth region and being in contact with the second electrode;
a tenth region provided between the part of the eighth region in contact with the first insulation film and the ninth region; and
a third electrode electrically connected with the third region.

5. The device according to claim 1, wherein the group consists of B (boron), Ti (titanium) and V (vanadium).

6. A semiconductor device comprising:
a first region provided in a silicon carbide layer; and
a second region provided around the first region in the silicon carbide layer, the second region having a higher concentration of at least one kind of a lifetime killer impurity selected from the group consisting of B (boron), Ti (titanium), V (vanadium), He (helium) and H⁺ (proton) than a concentration of a lifetime killer impurity in the first region, wherein the silicon carbide layer includes:
a first surface;
a second surface;
a second conductivity-type third region provided between the first surface and the second surface, the third region provided in the first region and the second region; and
a first conductivity-type fourth region provided between the first surface and the third region, the fourth region provided in the first region and the second region, and wherein
the second region includes a second conductivity-type fifth region, a second distance of the fifth region from the second surface is longer than a first distance of the fifth region from the first surface, and wherein
the fifth region includes a concentration of B, Ti or V which has a maximal value at a point where a fourth distance of the fifth region from the second surface is longer than a third distance of the fifth region from the first surface, and wherein
the second region further includes a first conductivity-type sixth region containing the lifetime killer impurity, and wherein
the sixth region includes a concentration of B, Ti or V which has a maximal value at a point where an eighth distance from the second surface is longer than a seventh distance from the first surface.

7. The device according to claim 6, wherein a current flows in the first region when a voltage is applied to the semiconductor device.

8. The device according to claim 6, wherein a carrier lifetime of the second region is 1 µs or less.

9. The device according to claim 6, wherein a sixth distance from the second surface to the sixth region is longer than a fifth distance from the first surface to the sixth region.

10. The device according to claim 6, further comprising:
a first insulation film provided on the first surface in the first region;
a first electrode provided on the first insulation film;
a second insulation film provided around the first electrode;
a second electrode provided around the second insulation film on the first surface, a part of the second electrode being in contact with the first surface;
an eighth region provided in the fourth region, a part of the eighth region being in contact with the first insulation film;
a ninth region provided in the eighth region and being in contact with the second electrode;
a tenth region provided between the part of the eighth region in contact with the first insulation film and the ninth region; and
a third electrode electrically connected with the third region.

11. The device according to claim 6, wherein the group consists of B (boron), Ti (titanium) and V (vanadium).

12. A semiconductor device comprising:
a first region provided in a silicon carbide layer; and
a second region provided around the first region in the silicon carbide layer, the second region having a higher concentration of at least one kind of a lifetime killer impurity selected from the group consisting of B (boron), Ti (titanium), V (vanadium), He (helium) and H⁺ (proton) than a concentration of a lifetime killer impurity in the first region, wherein the silicon carbide layer includes:
a first surface;

a second surface;

a second conductivity-type third region provided between the first surface and the second surface, the third region provided in the first region and the second region; and a first conductivity-type fourth region provided between the first surface and the third region, the fourth region provided in the first region and the second region, and wherein the second region includes a second conductivity-type fifth region, a second distance of the fifth region from the second surface is longer than a first distance of the fifth region from the first surface, and wherein the fifth region includes a concentration of B, Ti or V which has a maximal value at a point where a fourth distance of the fifth region from the second surface is longer than a third distance of the fifth region from the first surface, and wherein the second region further includes a first conductivity-type sixth region containing the lifetime killer impurity, and wherein the sixth region includes a concentration of B, Ti or V which is $1/10$ or more and $1/2$ or less of a concentration of a first conductivity-type impurity in the fourth region.

13. The device according to claim 12, wherein a current flows in the first region when a voltage is applied to the semiconductor device.

14. The device according to claim 12, wherein a carrier lifetime of the second region is 1 μs or less.

15. The device according to claim 12, wherein a sixth distance from the second surface to the sixth region is longer than a fifth distance from the first surface to the sixth region.

16. The device according to claim 12, further comprising:
a first insulation film provided on the first surface in the first region;
a first electrode provided on the first insulation film;
a second insulation film provided around the first electrode;
a second electrode provided around the second insulation film on the first surface, a part of the second electrode being in contact with the first surface;
an eighth region provided in the fourth region, a part of the eighth region being in contact with the first insulation film;
a ninth region provided in the eighth region and being in contact with the second electrode;
a tenth region provided between the part of the eighth region in contact with the first insulation film and the ninth region; and
a third electrode electrically connected with the third region.

17. The device according to claim 12, wherein the group consists of B (boron), Ti (titanium) and V (vanadium).

* * * * *